(12) United States Patent
Huang

(10) Patent No.: US 12,212,333 B2
(45) Date of Patent: Jan. 28, 2025

(54) CIRCUIT FOR SAR ADC

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 174 days.

(21) Appl. No.: 18/156,385

(22) Filed: Jan. 19, 2023

(65) Prior Publication Data

US 2023/0246653 A1 Aug. 3, 2023

(30) Foreign Application Priority Data

Jan. 28, 2022 (TW) .................................. 111104177

(51) Int. Cl.
*H03M 1/38* (2006.01)
*H03F 3/45* (2006.01)
*H03K 19/003* (2006.01)

(52) U.S. Cl.
CPC .......... *H03M 1/38* (2013.01); *H03F 3/45385* (2013.01); *H03K 19/00361* (2013.01)

(58) Field of Classification Search
CPC .................................. H03M 1/38; H03M 1/45
See application file for complete search history.

(56) References Cited

U.S. PATENT DOCUMENTS

| 8,928,406 | B2 | 1/2015 | Albinet | |
| 11,815,369 | B2* | 11/2023 | Liao | G01R 27/2605 |

(Continued)

FOREIGN PATENT DOCUMENTS

| DE | 112014000440 T5 | 10/2015 |
| WO | WO2021058630 A1 | 4/2021 |

OTHER PUBLICATIONS

Teo, T. H., Khoo, E.-S., Uday, D., & Tear, C.-B. (n.d.). Design, analysis, and implementation of analog complex filter for low-if wireless LAN application. 17th International Conference on VLSI Design. Proceedings. https://doi.org/10.1109/icvd.2004.1260958.

(Continued)

*Primary Examiner* — Lam T Mai
(74) *Attorney, Agent, or Firm* — WPAT, P.C.; Anthony King

(57) ABSTRACT

The application discloses a circuit, including: a positive-terminal p-type transistor; a negative-terminal p-type transistor; a positive-terminal n-type transistor, wherein the positive-terminal p-type transistor and the positive-terminal n-type transistor are cascoded between a first reference voltage and a second reference voltage; a negative-terminal n-type transistor, wherein the negative-terminal p-type transistor and the negative-terminal n-type transistor are cascoded between the first reference voltage and the second reference voltage; a first positive-terminal capacitor, a top plate of the first positive-terminal capacitor is coupled to a gate of the positive-terminal n-type transistor; a first negative-terminal capacitor, a top plate of the first negative-terminal capacitor is coupled to a gate of the negative-terminal n-type transistor; a first control circuit, arranged to generate a first control signal to bottom plates of the first positive-terminal capacitor and the first negative-terminal capacitor according to the positive-terminal output signal, the negative-terminal output signal and the target common mode voltage.

20 Claims, 7 Drawing Sheets

(56) References Cited

U.S. PATENT DOCUMENTS

| | | | |
|---|---|---|---|
| 2013/0249602 A1* | 9/2013 | Mauder | H01L 29/7801 257/341 |
| 2018/0083645 A1* | 3/2018 | Monangi | H03M 3/378 |
| 2019/0013817 A1 | 1/2019 | Koli | |
| 2019/0173478 A1 | 6/2019 | Monangi et al. | |
| 2020/0044613 A1* | 2/2020 | Chen | H03F 1/083 |
| 2020/0274546 A1* | 8/2020 | Kim | H03M 1/466 |
| 2021/0265957 A1* | 8/2021 | Ho | H03M 1/1295 |
| 2022/0321823 A1* | 10/2022 | Katase | H04N 25/7795 |
| 2023/0026826 A1* | 1/2023 | Qin | G11C 7/222 |
| 2023/0179161 A1* | 6/2023 | Chen | H03G 3/008 330/254 |
| 2023/0184567 A1* | 6/2023 | Liao | G01R 27/2605 |
| 2023/0246613 A1* | 8/2023 | Huang | H03F 3/45237 330/253 |
| 2023/0246653 A1* | 8/2023 | Huang | H03F 3/45385 341/161 |
| 2023/0396250 A1* | 12/2023 | Tsai | H03K 19/018514 |
| 2024/0039493 A1* | 2/2024 | Huang | H03F 3/45269 |

OTHER PUBLICATIONS

Custódio, J. R., Figueiredo, M., Santin, E., Goes, J. (2010). A CMOS inverter-based self-biased fully differential amplifier. IFIP Advances in Information and Communication Technology, 541-548. https://doi.org/10.1007/978-3-642-11628-5_60.

Office Action and Cited References dated on Sep. 5, 2022 issued by the Taiwan Intellectual Property Office for the Taiwan counterpart application 111104177.

English abstract translation of the office action dated on Sep. 5, 2022 issued by the Taiwan Intellectual Property Office for the Taiwan application 111104177.

* cited by examiner

CIRCUIT FOR SAR ADC

CROSS-REFERENCE TO RELATED APPLICATIONS

This application claims priority of Taiwan application No. 111104177 filed on Jan. 28, 2022, which is incorporated by reference in its entirety.

TECHNICAL FIELD

The present application relates to a circuit, particularly to an amplifier and a circuit for use in a successive approximation register (SAR) analogous to digital converter (ADC).

BACKGROUND

When the common mode voltage of a differential amplifier deviates from the preset value, the output dynamic range is compressed. Moreover, as the process advances, the operating voltage becomes lower and lower. Therefore, how to effectively adjust the common-mode voltage of the amplifier without cascoding additional transistor has become one of the most important issues in this field.

SUMMARY OF THE INVENTION

The present application provides a circuit, including: a positive-terminal p-type transistor; a negative-terminal p-type transistor; a positive-terminal n-type transistor, wherein the positive-terminal p-type transistor and the positive-terminal n-type transistor are cascoded between first reference voltage and second reference voltage, a drain of the positive-terminal n-type transistor is coupled to a drain of the positive-terminal p-type transistor and outputs a positive-terminal output signal; a negative-terminal n-type transistor, wherein the negative-terminal p-type transistor and the negative-terminal n-type transistor are cascoded between the first reference voltage and the second reference voltage, a drain of the negative-terminal n-type transistor is coupled to a drain of the negative-terminal p-type transistor and outputs a negative-terminal output signal; a first positive-terminal capacitor, wherein a top plate of the first positive-terminal capacitor is coupled to a gate of the positive-terminal n-type transistor; a first negative-terminal capacitor, wherein a top plate of the first negative-terminal capacitor is coupled to a gate of the negative-terminal n-type transistor; and a first control circuit, configured to generate a first control signal according to the positive-terminal output signal, the negative-terminal output signal and the target common mode voltage, wherein the first control signal is selectively coupled to the top plate of the first positive-terminal capacitor and the top plate of the first negative-terminal capacitor; wherein a positive-terminal input signal of the amplifier is selectively coupled to a bottom plate of the first positive-terminal capacitor, and a negative-terminal input signal of the amplifier is selectively coupled to a bottom plate of the first negative-terminal capacitor.

The present application provides a circuit, including: a positive-terminal p-type transistor; a negative-terminal p-type transistor; a positive-terminal n-type transistor, wherein the positive-terminal p-type transistor and the positive-terminal n-type transistor are cascoded between first reference voltage and second reference voltage, a drain of the positive-terminal n-type transistor is coupled to a drain of the positive-terminal p-type transistor and outputs a positive-terminal output signal; a negative-terminal n-type transistor, wherein the negative-terminal p-type transistor and the negative-terminal n-type transistor are cascoded between the first reference voltage and the second reference voltage, a drain of the negative-terminal n-type transistor is coupled to a drain of the negative-terminal p-type transistor and outputs a negative-terminal output signal; a first positive-terminal capacitor, wherein a top plate of the first positive-terminal capacitor is coupled to a gate of the positive-terminal n-type transistor; a first negative-terminal capacitor, wherein a top plate of the first negative-terminal capacitor coupled to a gate of the negative-terminal n-type transistor; and a first control circuit, configured to generate a first control signal to the bottom plate of the first positive-terminal capacitor and the bottom plate of the first negative-terminal capacitor according to the positive-terminal output signal, the negative-terminal output signal and the target common mode voltage; wherein a positive-terminal input signal of the amplifier is selectively coupled to a top plate of the first positive-terminal capacitor, and a negative-terminal input signal of the amplifier is selectively coupled to a top plate of the first negative-terminal capacitor.

The present application is able to effectively adjust the common-mode voltage of the amplifier without cascoding additional transistor.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1A:
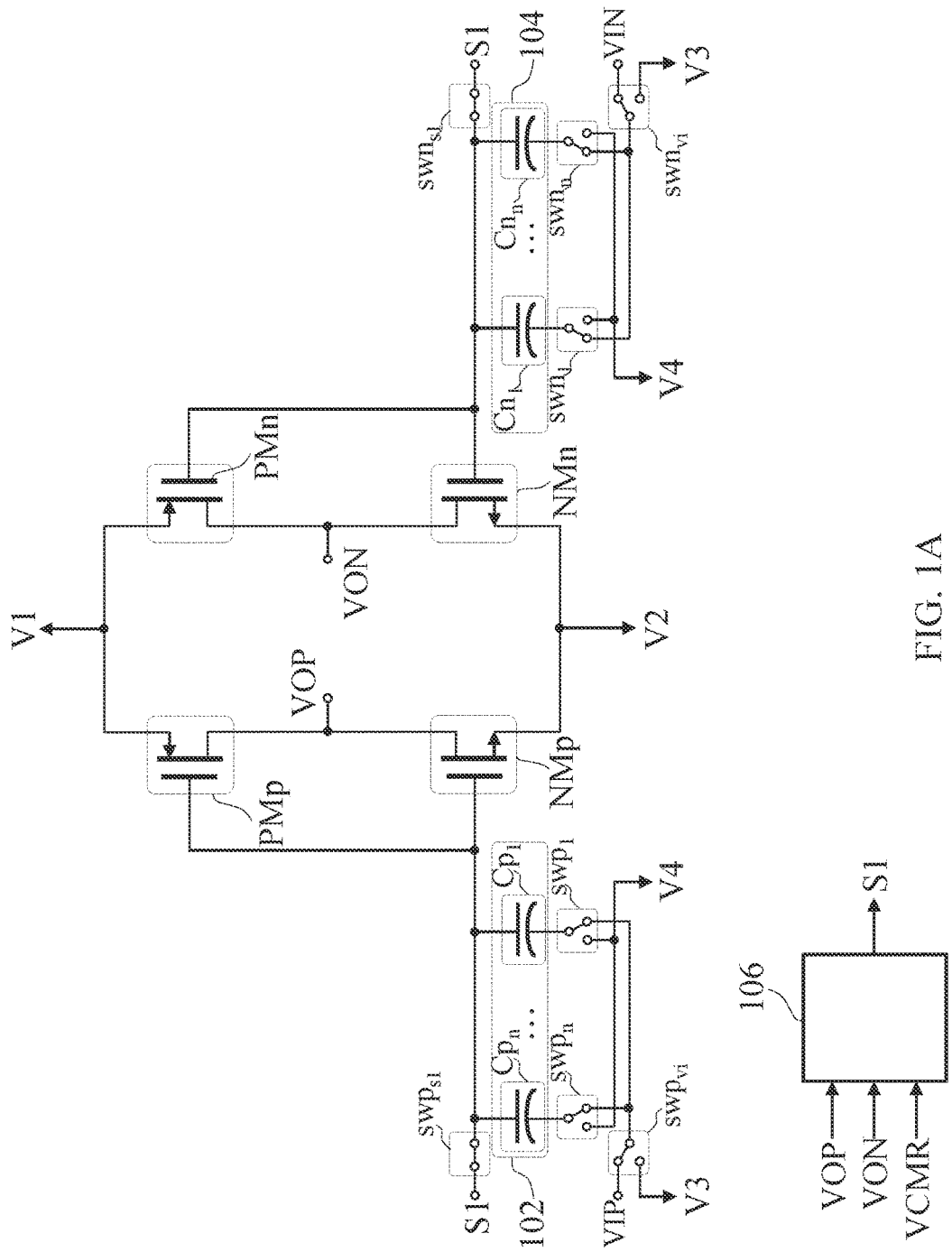
FIG. 1A is a schematic diagram illustrating circuit operated in a sampling stage according to the first embodiment of the present application.
Figure 1B:
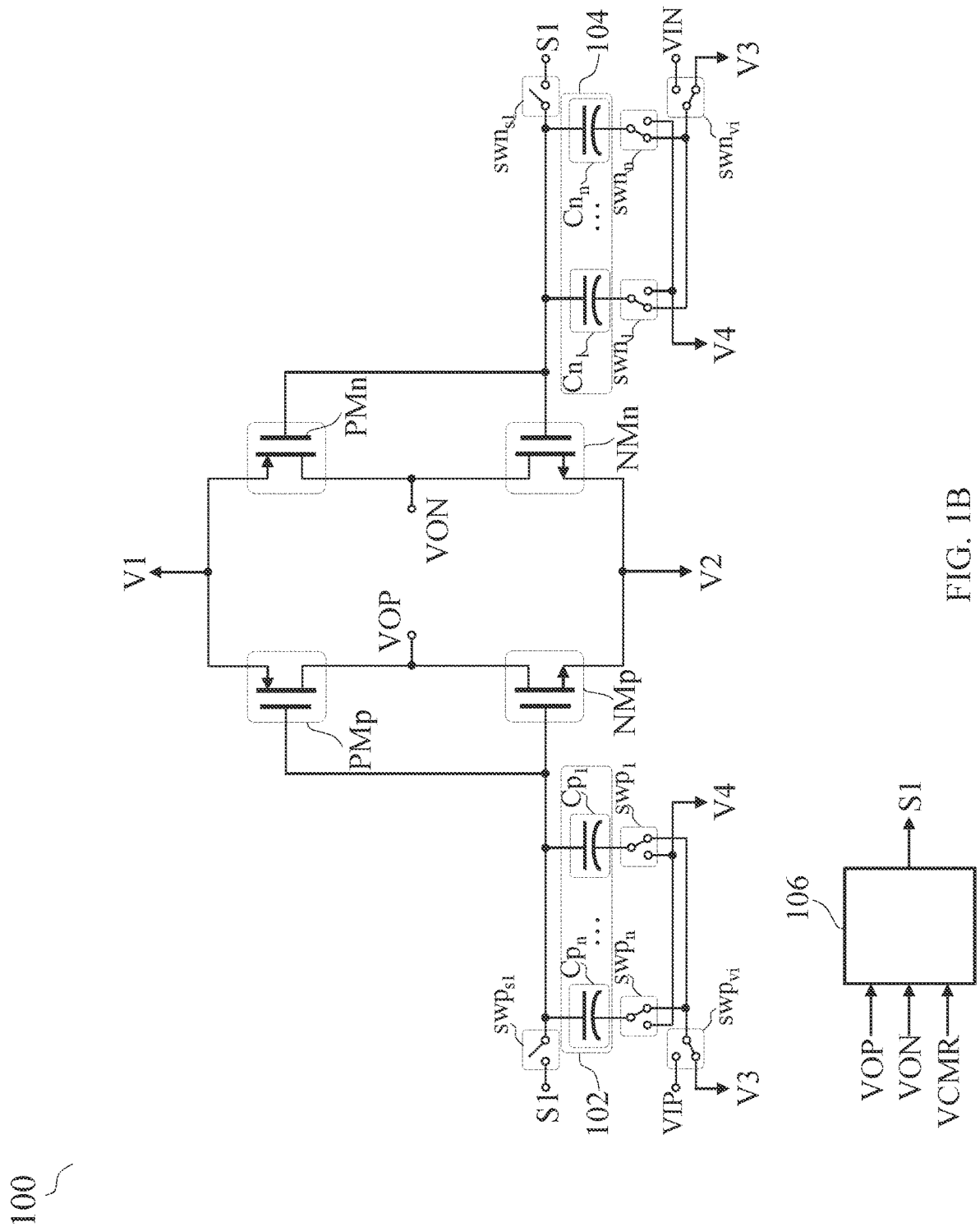
FIG. 1B stage is a schematic diagram illustrating a circuit operated in a charge re-distribution according to the first embodiment of the present application.

FIG. 1A and FIG. 1B are schematic diagrams illustrating a circuit according to the first embodiment of the present application. The circuit 100 includes an amplifier formed consisting of a positive-terminal p-type transistor PMp, a negative-terminal p-type transistor PMn, a positive-terminal n-type transistor NMp and a negative-terminal n-type transistor NMn, and the circuit 100 further includes a positive-terminal capacitor array 102 and a negative-terminal capacitor array 104. In this case, the positive-terminal p-type transistor PMp and the positive-terminal n-type transistor NMp are stacked between the reference voltage V1 and the reference voltage V2; the negative-terminal p-type transistor PMn and the negative-terminal n-type transistor NMn are stacked between the reference voltage V1 and the reference voltage V2. In particular, the drain of the positive-terminal p-type transistor PMp is coupled to the drain of the positive-terminal n-type transistor NMp; the drain of the negative-terminal p-type transistor PMn is coupled to the drain of the negative-terminal n-type transistor NMn.

In the present embodiment, the reference voltage V1 is greater than the reference voltage V2, and the reference voltage V2 is the ground voltage. The differential input signal pair of the circuit 100 includes a positive-terminal input signal VIP and a negative-terminal input signal VIN, respectively coupled to the positive-terminal n-type transistor NMp and the gate of the positive-terminal p-type transistor PMp and the negative-terminal n-type transistor NMn and the gate of the negative-terminal p-type transistor PMn via the positive-terminal capacitor array 102 and the negative-terminal capacitor array 104; the differential output signal pair includes a positive-terminal output signal VOP and a negative-terminal output signal VON, respectively outputted from the drain of the positive-terminal p-type transistor PMp and the drain of the negative-terminal p-type transistor PMn.

The positive-terminal capacitor array 102 includes n capacitors $Cp_1$ to $Cp_n$, and the negative-terminal capacitor array 104 includes n capacitors $Cn_1$ to $Cn_n$, wherein n is am integer greater than zero. The top plate of each capacitor of capacitors $Cp_1$ to $Cp_n$ (the straight line portion of the capacitor) is coupled to the gate of the positive-terminal n-type transistor NMp and the gate of the positive-terminal p-type transistor PMp, and is coupled to the control signal S1 via a switch $swp_{s1}$. The bottom plate of each capacitor of capacitors $Cp_1$ to $Cp_n$ (the arc line portion of the capacitor) is selectively coupled to the positive-terminal input signal VIP, the reference voltage V3 or the reference voltage V4 via the switch $swp_{vi}$ and the switches $swp_1$ to $swp_n$. The top plate of each capacitor of capacitors $Cn_1$ to $Cn_n$ (the straight line portion of the capacitor) is coupled to the gate of the negative-terminal n-type transistor NMn and the gate of the negative-terminal p-type transistor PMn, and is coupled to the control signal S1 via the switch $swn_{s1}$. The bottom plate of each capacitor of capacitors $Cn_1$ to $Cn_n$ (the arc line portion of the capacitor) is selectively coupled to the negative-terminal input signal VIN, the reference voltage V3 or the reference voltage V4 via the switch $swn_{vi}$ and the switches $swn_1$ to $swn_n$.

Generally, the conductivities of the positive-terminal n-type transistor NMp, the negative-terminal n-type transistor NMn, the positive-terminal p-type transistor PMp and the negative-terminal p-type transistor PMn are determined at the beginning of the circuit designing process, such that the common mode voltage of the positive-terminal output signal VOP and the negative-terminal output signal VON is maintained at the target common mode voltage VCMR, e.g., (V1+V2)/2. However, in reality, the conductivity or conduction degree of the positive-terminal n-type transistor NMp and the negative-terminal n-type transistor NMn may be greater than the conductivity or conduction degree of the positive-terminal p-type transistor PMp and the negative-terminal p-type transistor PMn due to changes in the manufacturing process, supply voltage or temperature, such that the common mode voltage deviates from the target common mode voltage VCMR.

Therefore, in the present embodiment, a control circuit 106 is additional arranged in the amplifier 100 to control the degree of conduction of the positive-terminal p-type transistor PMp, the positive-terminal n-type transistor NMp, the negative-terminal p-type transistor PMn and the negative-terminal n-type transistor NMn.

In particular, control circuit 106 can determine the common mode voltage according to the positive-terminal output signal VOP and the negative-terminal output signal VON, and then estimate the control signal S1 according to the common mode voltage and the target common mode voltage VCMR; however, the present embodiment is not limited thereto. In certain embodiments, control circuit 106 can include a comparator, configured to compare the common mode voltage with the target common mode voltage VCMR, and the control circuit 106 generates the control signal S1 accordingly. In certain embodiments, the control circuit 106 can include an integrator, configured to integrate the difference between the common mode voltage and the target common mode voltage VCMR, and the control circuit 106 generates the control signal S1 accordingly.

In certain embodiments, the circuit 100 further includes a comparator and a successive approximation register (SAR) analogous to digital converter (ADC) controller (not shown in the drawing) to form a SAR ADC with the bottom plate sampling type. In this case, the comparator is configured to generate a comparison result according to the positive-terminal output signal VOP and the negative-terminal output signal VON. The SAR ADC controller is configured to control the coupling relationship between the positive-terminal capacitor array 102 with respect to the control signal S1, the positive-terminal input signal VIP, the reference voltage V3 and the reference voltage V4, and control the coupling relationship between the negative-terminal capacitor array 104 with respect to control signal S1, the negative-terminal input signal VIN, the reference voltage V3 and the reference voltage V4, according to the comparison result, so that the circuit 100 can be operated in each operation stage of the SAR ADC.

When the circuit 100 operates in a sampling stage, the SAR ADC controller controls the switches $swp_{s1}$, $swp_{vi}$ and $swp_1$ to $swp_n$ to become the configuration shown in FIG. 1A, such that the positive-terminal capacitor array 102 is coupled to the control signal S1 and the positive-terminal input signal VIP; the SAR ADC controller further controls the switches $swn_{s1}$, $swn_{vi}$ and $swn_1$ to $swn_n$, such that the negative-terminal capacitor array 104 is coupled to the control signal S1 and the negative-terminal input signal VIN. In this stage, the common mode voltage is calibrated according to the control signal S1.

When the circuit 100 exits the sampling stage and enters the charge re-distribution stage, the SAR ADC controller controls the switches $swp_{s1}$, $swp_{vi}$ and $swp_1$ to $swp_n$ to become the configuration shown in FIG. 1B, such that the positive-terminal capacitor array 102 is coupled to the reference voltage V3 or V4 but is not coupled to the control signal S1 and the positive-terminal input signal VIP, depending on the results of the successive approximation; the SAR ADC controller further controls the switches $swn_{s1}$, $swn_{vi}$ and $swn_1$ to $swn_n$, such that the negative-terminal capacitor array 104 is coupled to the reference voltage V3 or V4 but is not coupled to the control signal S1 and the negative-terminal input signal VIN, depending on the results of the successive approximation.

For example, if the control circuit 106 determines that the common mode voltage is too low, it can reduce the voltage of the control signal S1 during the sampling stage; in this way, the voltages of the gates of the positive-terminal p-type transistor PMp, the positive-terminal n-type transistor NMp, the negative-terminal p-type transistor PMn and the negative-terminal n-type transistor NMn are reduced, so as to increase the degree of conduction of the positive-terminal p-type transistor PMp and the negative-terminal p-type transistor PMn and inhibit the degree of conduction of the positive-terminal n-type transistor NMp and the negative-terminal n-type transistor NMn, so as to increase the common mode voltage; if the control circuit 106 determines that the common mode voltage is too high, then the opposite operations are performed.

Figure 2:
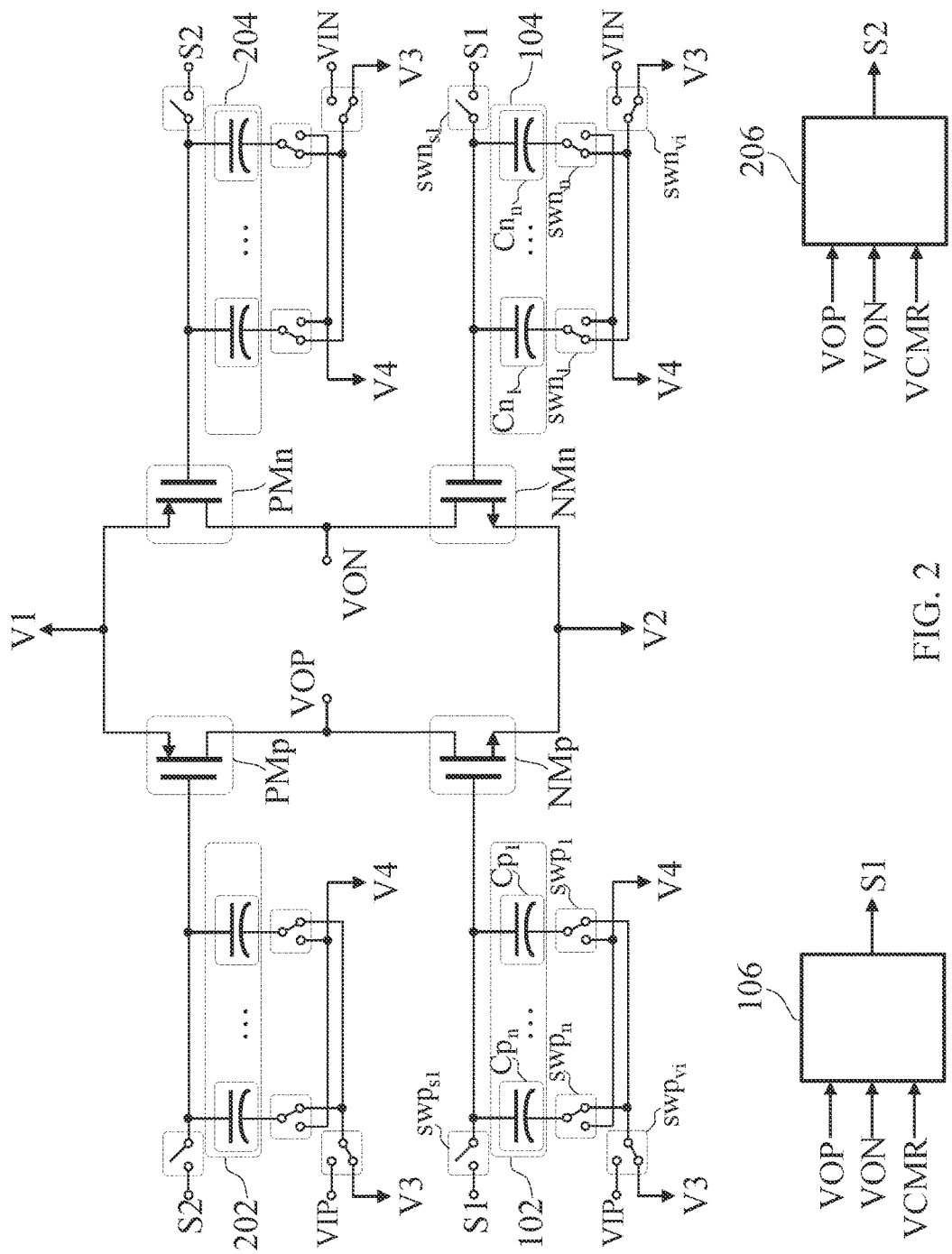
FIG. 2 is a schematic diagram illustrating a circuit according to the second embodiment of the present application.

FIG. 2 is a schematic diagram illustrating a circuit according to the second embodiment of the present application. In the circuit 200, the positive-terminal capacitor array 102 is no longer coupled to the positive-terminal p-type transistor PMp and the gate of the positive-terminal n-type transistor NMp at the same time, but only coupled to the gate of the positive-terminal n-type transistor NMp; the negative-terminal capacitor array 104 is no longer coupled to the negative-terminal p-type transistor PMn and the gate of the negative-terminal n-type transistor NMn at the same time, but only coupled to the gate of the negative-terminal n-type transistor NMn. The circuit 200 additionally includes a positive-terminal capacitor array 202, coupled to the gate of the positive-terminal p-type transistor PMp; and the negative-terminal capacitor array 204 is coupled to the gate of the negative-terminal p-type transistor PMn. The structures and controlling methods of the positive-terminal capacitor array 202 and the positive-terminal capacitor array 102 may be the same, the structures and controlling methods of the negative-terminal capacitor array 204 and the negative-terminal capacitor array 104 may be the same, except that the positive-terminal capacitor array 202 and the negative-terminal capacitor array 204 can receive a control signal S2 generated in the control circuit 206. Because the control signal S2 can be different from the control signal S1, when adjusting the common mode voltage, it is feasible to apply different voltages on the gate of the positive-terminal p-type transistor PMp and the gate of the positive-terminal n-type transistor NMp, and apply different voltages on the gate of the negative-terminal p-type transistor PMn and the gate of the negative-terminal n-type transistor NMn. In certain embodiments, the control signal S2 can also be replaced with the control signal S1.

Figure 3A:
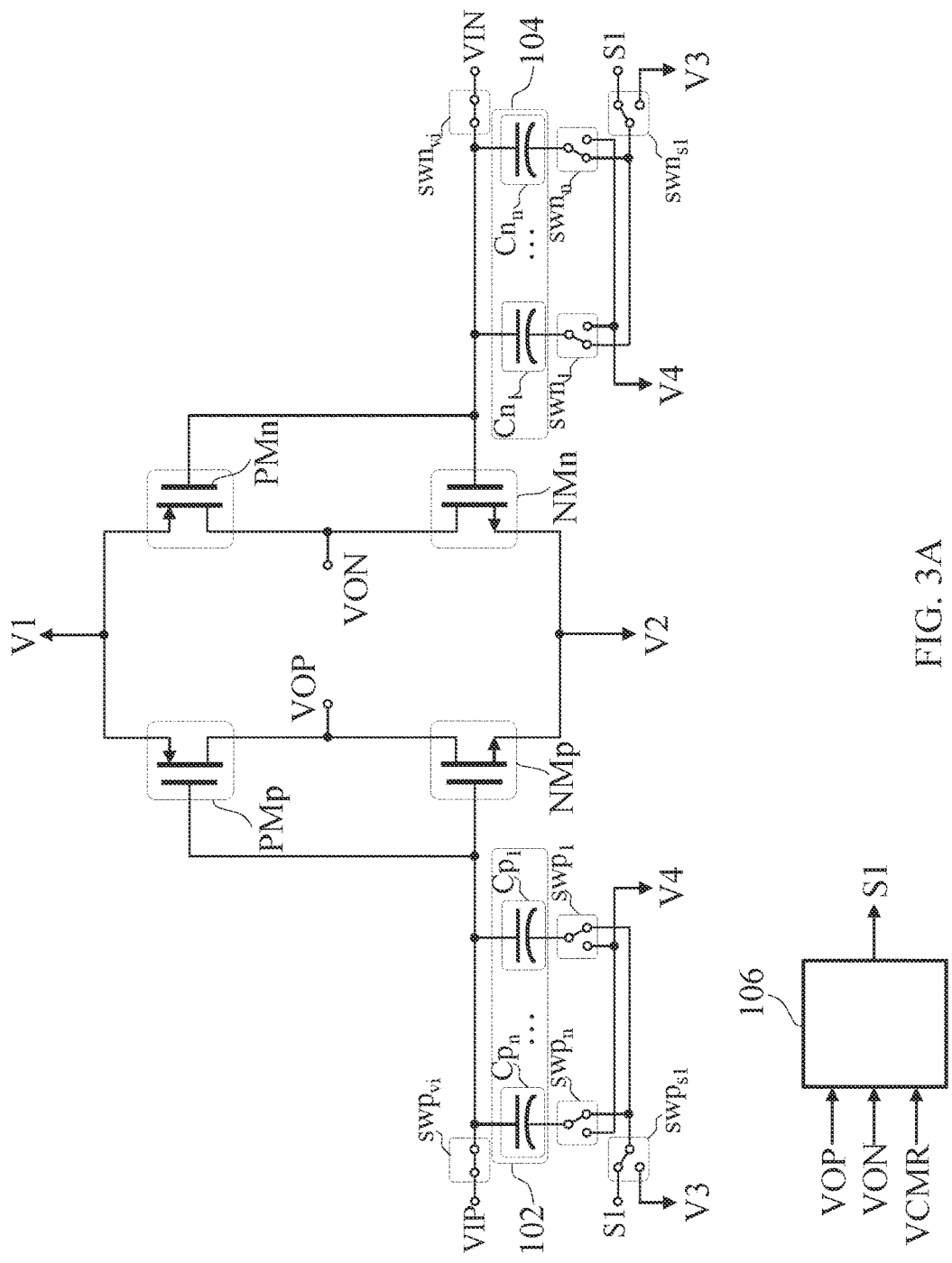
FIG. 3A is a schematic diagram illustrating circuit operated in a sampling stage according to the third embodiment of the present application.
Figure 3B:
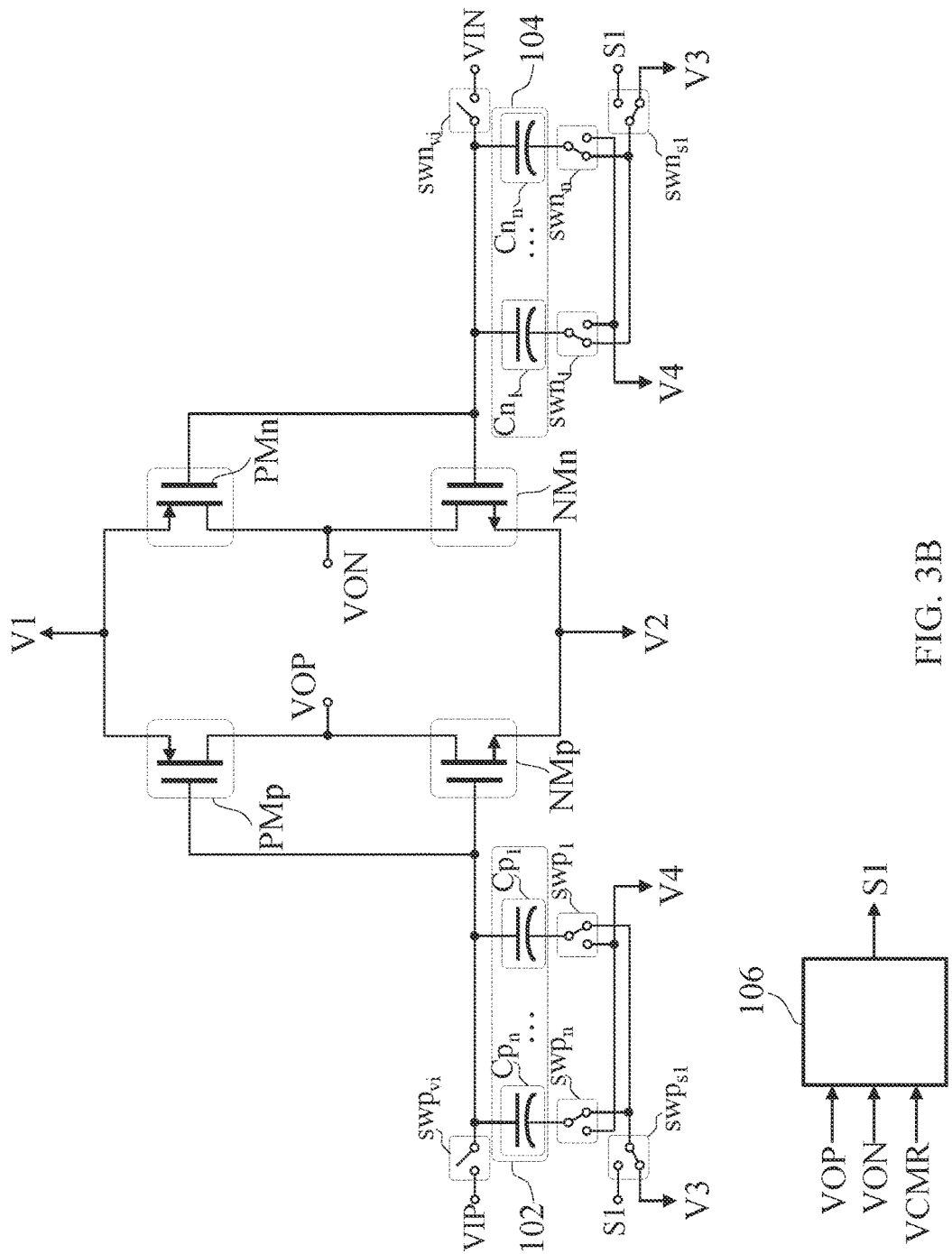
FIG. 3B stage is a schematic diagram illustrating a circuit operated in a charge re-distribution according to the third embodiment of the present application.

FIG. 3A and FIG. 3B are schematic diagrams illustrating a circuit according to the third embodiment of the present application. The circuit 300 differs from the circuit 100 in that the control signal S1 is fed from the bottom plates of the capacitors $Cp_1$ to $Cp_n$ of the positive-terminal capacitor array 102 and the capacitors $Cn_1$ to $Cn_n$ of the negative-terminal capacitor array 104, whereas the positive-terminal input signal VIP and the negative-terminal input signal VIN are respectively fed from the top plates of the capacitors $Cp_1$ to $Cp_n$ of the positive-terminal capacitor array 102 and the capacitors $Cn_1$ to $Cn_n$ of the negative-terminal capacitor array 104.

In certain embodiments, the circuit 300 further includes a comparator and a SAR ADC controller (not shown in the drawing) to form a SAR ADC with the top plate sampling type. In this case, the comparator is configured to generate a comparison result according to the positive-terminal output signal VOP and the negative-terminal output signal VON. The SAR ADC controller is configured to control the coupling relationship between the positive-terminal capacitor array 102 with respect to the control signal S1, the positive-terminal input signal VIP, the reference voltage V3 and the reference voltage V4, and control the coupling relationship between the negative-terminal capacitor array 104 with respect to control signal S1, the negative-terminal input signal VIN, the reference voltage V3 and the reference voltage V4, according to the comparison result, so that the circuit 300 can be operated in each operation stage of the SAR ADC.

When the circuit 300 operates in a sampling stage, the SAR ADC controller controls the switches $swp_{s1}$, $swp_{vi}$ and $swp_1$ to $swp_n$ to become the configuration shown in FIG. 3A, such that the positive-terminal capacitor array 102 is coupled to the control signal S1 and the positive-terminal input signal VIP; the SAR ADC controller further controls the switches $swn_{s1}$, $swn_{vi}$ and $swn_1$ to $swn_n$, such that the negative-terminal capacitor array 104 is coupled to the control signal S1 and the negative-terminal input signal VIN.

When the circuit 300 exits the sampling stage and enters the charge re-distribution stage, the SAR ADC controller controls the switches $swp_{s1}$, $swp_{vi}$ and $swp_1$ to $swp_n$ to become the configuration shown in FIG. 3B, such that the positive-terminal capacitor array 102 is not coupled to the positive-terminal input signal VIP, and the negative-terminal capacitor array 104 is not coupled to the negative-terminal input signal VIN. Also, the positive-terminal capacitor array 102 and the negative-terminal capacitor array 104 are changed from being coupled to the control signal S1 to being coupled to the reference voltage V3 or the reference voltage V4. For example, when being coupled to the reference voltage V3, the voltage difference between the reference voltage V3 and the control signal S1 is reflected on the top plates of the capacitors $Cp_1$ to $Cp_n$ of the positive-terminal capacitor array 102 and the capacitors $Cn_1$ to $Cn_n$ of the negative-terminal capacitor array 104, thereby calibrating the common mode voltage. Then, the SAR ADC controller controls the positive-terminal capacitor array 102 and the negative-terminal capacitor array 104 to be coupled to the reference voltage V3 or V4, depending on the results of the successive approximation.

For example, if the control circuit 106 determines that the common mode voltage is too low, it can increase the voltage of the control signal S1 during the sampling stage; when the circuit 300 exits the sampling stage and enters the charge re-distribution stage, the voltage of the control signal S1 will be reversely reflected on the gates of the positive-terminal p-type transistor PMp, the positive-terminal n-type transistor NMp, the negative-terminal p-type transistor PMn and the negative-terminal n-type transistor NMn. In this way, the voltages of the gates of the positive-terminal p-type transistor PMp, the positive-terminal n-type transistor NMp, the negative-terminal p-type transistor PMn and the negative-terminal n-type transistor NMn are reduced, so as to increase the degree of conduction of the positive-terminal p-type transistor PMp and the negative-terminal p-type transistor PMn and inhibit the degree of conduction of the positive-terminal n-type transistor NMp and the negative-terminal n-type transistor NMn, so as to increase the common mode voltage; if the control circuit 106 determines that the common mode voltage is too high, then the opposite operations are performed.

Figure 4:
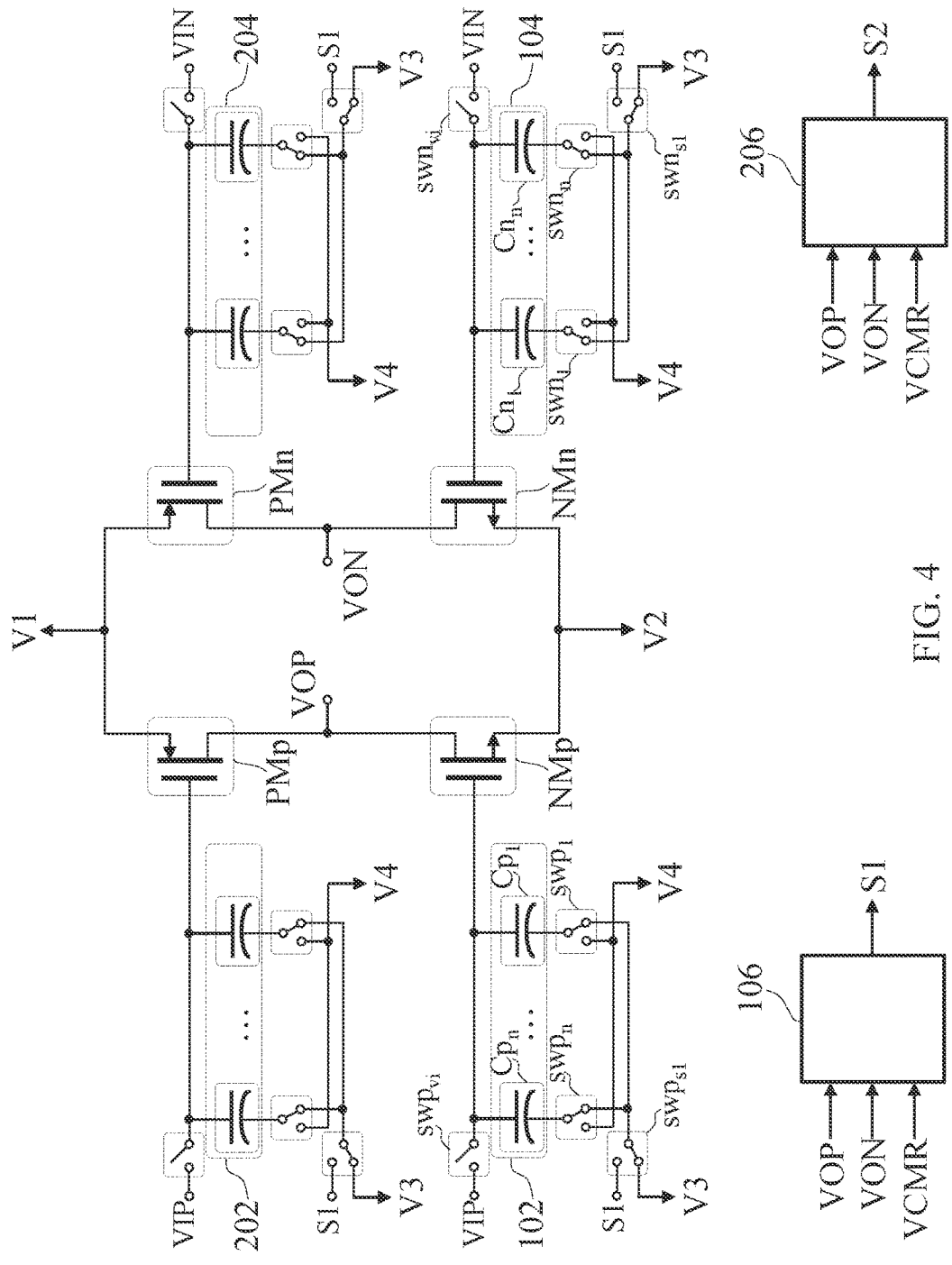
FIG. 4 is a schematic diagram illustrating a circuit according to the fourth embodiment of the present application.

FIG. 4 is a schematic diagram illustrating a circuit according to the fourth embodiment of the present application. The circuit 400 is a variation based on the circuit 300, and the principles of variation are the same as the variations between the circuit 100 and the circuit 200; hence, details thereof are omitted.

Figure 5:
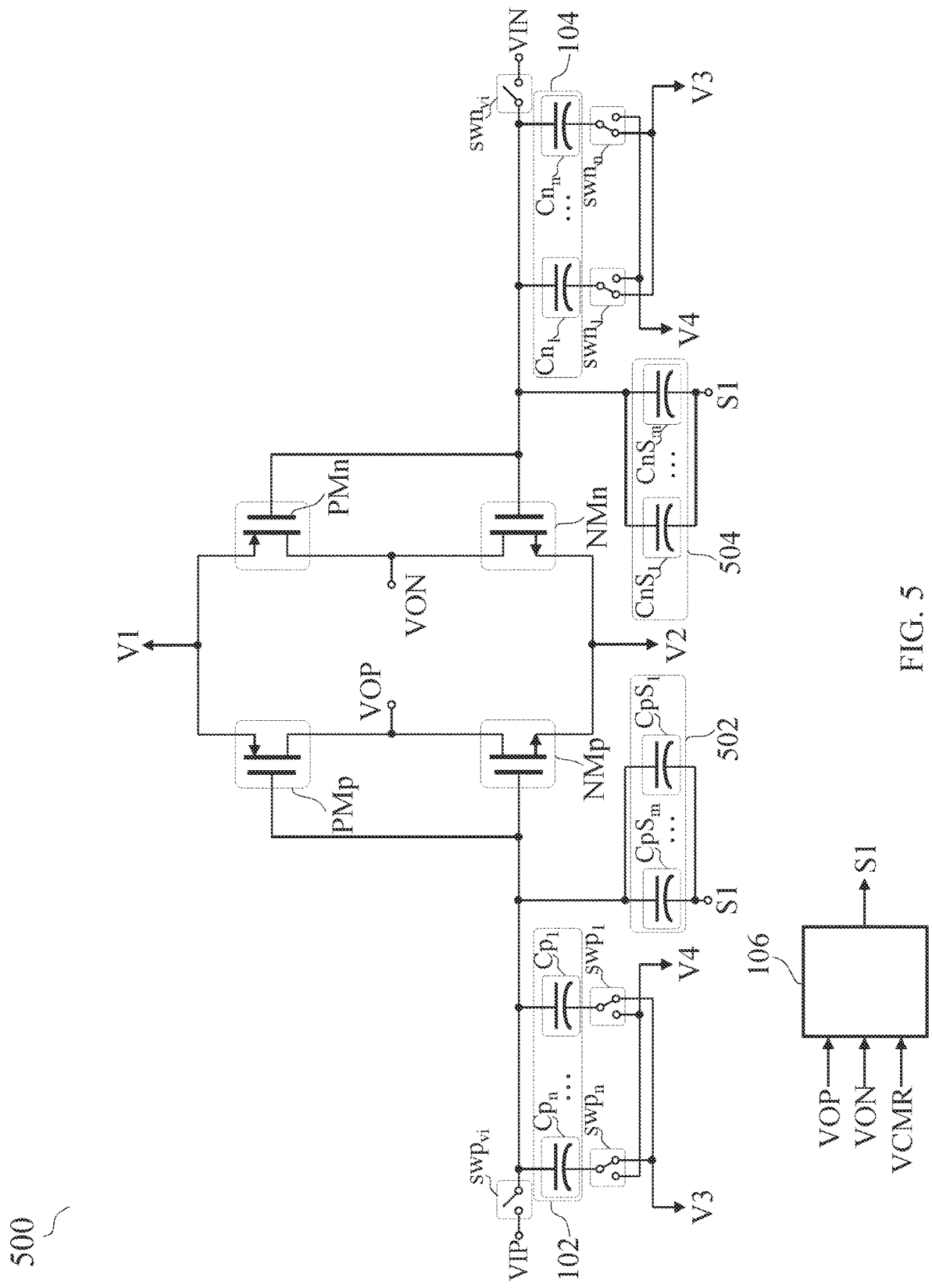
FIG. 5 is a schematic diagram illustrating a circuit according to the fifth embodiment of the present application.

FIG. 5 is a schematic diagram illustrating a circuit according to the fifth embodiment of the present application. In the circuit 500, the positive-terminal capacitor array 102 and the negative-terminal capacitor array 104 are no longer coupled to the control signal S1; however, a positive-terminal capacitor array 502 and a negative-terminal capacitor array 504 are additionally arranged in addition to the positive-terminal capacitor array 102 and the negative-terminal capacitor array 104. The positive-terminal capacitor array 502 includes m capacitors $CpS_1$ to $CpS_m$, the negative-terminal capacitor array 504 includes m capacitors $CnS_1$ to $CnS_m$, wherein m is an integer greater than zero. The top plate of each capacitor of capacitors $CpS_1$ to $CpS_m$ (the straight line portion of the capacitor) is coupled to the gate of the positive-terminal n-type transistor NMp and the gate of the positive-terminal p-type transistor PMp, and is coupled to the positive-terminal input signal VIP via a switch $swp_{vi}$. The bottom plate of each capacitor of capacitors $CpS_1$ to $CpS_m$ (the arc line portion of the capacitor) is selectively coupled to the control signal S1. The top plate of each capacitor of capacitors $CnS_1$ to $CnS_m$ (the straight line portion of the capacitor) is coupled to the gate of the negative-terminal n-type transistor NMn and the gate of the negative-terminal p-type transistor PMn, and is coupled to the negative-terminal input signal VIN via the switch $swn_m$. The bottom plate of each capacitor of capacitors $CnS_1$ to $CnS_n$ (the arc line portion of the capacitor) is coupled to control signal S1.

If the control circuit 106 determines that the common mode voltage is too low, it can decrease the voltage of the control signal S1 and reduce the voltage of the gates of the positive-terminal p-type transistor PMp, the positive-terminal n-type transistor NMp, the negative-terminal p-type transistor PMn and the negative-terminal n-type transistor NMn voltage via the positive-terminal capacitor array 102 and the negative-terminal capacitor array 104, so as to increase the degree of conduction of the positive-terminal p-type transistor PMp and the negative-terminal p-type transistor PMn and inhibit the degree of conduction of the positive-terminal n-type transistor NMp and the negative-terminal n-type transistor NMn, so as to increase the common mode voltage; if the control circuit 106 determines that the common mode voltage is too high, then the opposite operations are performed.

What is claimed is:

1. A circuit, comprising:
    a positive-terminal p-type transistor;
    a negative-terminal p-type transistor;
    a positive-terminal n-type transistor, wherein the positive-terminal p-type transistor and the positive-terminal n-type transistor are cascoded between first reference voltage and second reference voltage, a drain of the positive-terminal n-type transistor is coupled to a drain of the positive-terminal p-type transistor and outputs a positive-terminal output signal;
    a negative-terminal n-type transistor, wherein the negative-terminal p-type transistor and the negative-terminal n-type transistor are cascoded between the first reference voltage and the second reference voltage, a drain of the negative-terminal n-type transistor is coupled to a drain of the negative-terminal p-type transistor and outputs a negative-terminal output signal;
    a first positive-terminal capacitor, wherein a top plate of the first positive-terminal capacitor is coupled to a gate of the positive-terminal n-type transistor;
    a first negative-terminal capacitor, wherein a top plate of the first negative-terminal capacitor is coupled to a gate of the negative-terminal n-type transistor; and
    a first control circuit, configured to generate a first control signal according to the positive-terminal output signal, the negative-terminal output signal and the target common mode voltage, wherein the first control signal is selectively coupled to the top plate of the first positive-terminal capacitor and the top plate of the first negative-terminal capacitor;
    wherein a positive-terminal input signal of an amplifier is selectively coupled to a bottom plate of the first positive-terminal capacitor, and a negative-terminal input signal of the amplifier is selectively coupled to a bottom plate of the first negative-terminal capacitor.

2. The circuit of claim 1, wherein the top plate of the first positive-terminal capacitor is further coupled to a gate of the positive-terminal p-type transistor, and the top plate of the first negative-terminal capacitor is further coupled to a gate of the negative-terminal p-type transistor.

3. The circuit of claim 1, wherein the bottom plate of the first positive-terminal capacitor and the bottom plate of the first negative-terminal capacitor are further selectively coupled to a third reference voltage or a fourth reference voltage.

4. The circuit of claim 3, further comprising:
    a second positive-terminal capacitor, forming a first positive-terminal capacitor array with the first positive-terminal capacitor, wherein a top plate of the second positive-terminal capacitor is coupled to the top plate of the first positive-terminal capacitor, and a bottom plate of the second positive-terminal capacitor is selectively coupled to the positive-terminal input signal, the third reference voltage or the fourth reference voltage; and
    a second negative-terminal capacitor, forming a first negative-terminal capacitor array with the first negative-terminal capacitor, wherein a top plate of the second negative-terminal capacitor is coupled to the top plate of the first negative-terminal capacitor, and a bottom plate of the second negative-terminal capacitor is selectively coupled to the negative-terminal input signal, the third reference voltage or the fourth reference voltage.

5. The circuit of claim 4, further comprising:
    a comparator, configured to generate a comparison result according to the positive-terminal output signal and the negative-terminal output signal; and
    a SAR ADC controller, configured to control the coupling relationship between the first positive-terminal capacitor array with respect to the first control signal, the positive-terminal input signal, the third reference voltage and the fourth reference voltage, and control the coupling relationship between the second positive-terminal capacitor array with respect to the first control signal, the negative-terminal input signal, the third reference voltage and the fourth reference voltage, according to the comparison result.

6. The circuit of claim 5, wherein in a sampling stage, the first positive-terminal capacitor array is coupled to the first control signal and the positive-terminal input signal, and the first negative-terminal capacitor array is coupled to the first control signal and the negative-terminal input signal.

7. The circuit of claim 1, wherein in a charge re-distribution stage, the first positive-terminal capacitor array and the first negative-terminal capacitor array are coupled to the third reference voltage or the fourth reference voltage, but not coupled to the first control signal.

8. The circuit of claim 1, wherein the first control circuit compares a common mode voltage of the positive-terminal output signal and the negative-terminal output signal with the target common mode voltage to generate the first control signal.

9. The circuit of claim 4, further comprising:
a second positive-terminal capacitor array, coupled to a gate of the positive-terminal p-type transistor, wherein the second positive-terminal capacitor array is selectively coupled to a second control signal, the positive-terminal input signal, the third reference voltage and the fourth reference voltage; and
a second negative-terminal capacitor array, coupled to a gate of the negative-terminal p-type transistor, wherein the second negative-terminal capacitor array is selectively coupled to second control signal, the negative-terminal input signal, the third reference voltage and the fourth reference voltage.

10. The circuit of claim 9, is further comprising a second control circuit, configured to generate the second control signal according to the positive-terminal output signal, the negative-terminal output signal and the target common mode voltage.

11. A circuit, comprising:
a positive-terminal p-type transistor;
a negative-terminal p-type transistor;
a positive-terminal n-type transistor, wherein the positive-terminal p-type transistor and the positive-terminal n-type transistor are cascoded between first reference voltage and second reference voltage, a drain of the positive-terminal n-type transistor is coupled to a drain of the positive-terminal p-type transistor and outputs a positive-terminal output signal;
a negative-terminal n-type transistor, wherein the negative-terminal p-type transistor and the negative-terminal n-type transistor are cascoded between the first reference voltage and the second reference voltage, a drain of the negative-terminal n-type transistor is coupled to a drain of the negative-terminal p-type transistor and outputs a negative-terminal output signal;
a first positive-terminal capacitor, wherein a top plate of the first positive-terminal capacitor is coupled to a gate of the positive-terminal n-type transistor;
a first negative-terminal capacitor, wherein a top plate of the first negative-terminal capacitor coupled to a gate of the negative-terminal n-type transistor; and
a first control circuit, configured to generate a first control signal to the bottom plate of the first positive-terminal capacitor and the bottom plate of the first negative-terminal capacitor according to the positive-terminal output signal, the negative-terminal output signal and the target common mode voltage;
wherein a positive-terminal input signal of an amplifier is selectively coupled to a top plate of the first positive-terminal capacitor, and a negative-terminal input signal of the amplifier is selectively coupled to a top plate of the first negative-terminal capacitor.

12. The circuit of claim 11, wherein the top plate of the first positive-terminal capacitor is further coupled to a gate of the positive-terminal p-type transistor, and the top plate of the first negative-terminal capacitor is further coupled to a gate of the negative-terminal p-type transistor.

13. The circuit of claim 11, wherein the bottom plate of the first positive-terminal capacitor and the bottom plate of the first negative-terminal capacitor are selectively coupled to the first control signal, third reference voltage or fourth reference voltage.

14. The circuit of claim 13, further comprising:
a second positive-terminal capacitor, forming a first positive-terminal capacitor array with the first positive-terminal capacitor, wherein a top plate of the second positive-terminal capacitor is coupled to the top plate of the first positive-terminal capacitor, and a bottom plate of the second positive-terminal capacitor is selectively coupled to the first control signal, the third reference voltage or the fourth reference voltage; and
a second negative-terminal capacitor, forming a first negative-terminal capacitor array with the first negative-terminal capacitor, wherein a top plate of the second negative-terminal capacitor is coupled to the top plate of the first negative-terminal capacitor, and a bottom plate of the second negative-terminal capacitor is selectively coupled to the first control signal, the third reference voltage or the fourth reference voltage.

15. The circuit of claim 14, further comprising:
a comparator, configured to generate a comparison result according to the positive-terminal output signal and the negative-terminal output signal; and
a SAR ADC controller, configured to control the coupling relationship between the first positive-terminal capacitor array with respect to the first control signal, the positive-terminal input signal, the third reference voltage and the fourth reference voltage, and control the coupling relationship between the second positive-terminal capacitor array with respect to the first control signal, the negative-terminal input signal, the third reference voltage and the fourth reference voltage, according to the comparison result.

16. The circuit of claim 15, wherein in a sampling stage, the first positive-terminal capacitor array is coupled to the first control signal and the positive-terminal input signal, and the first negative-terminal capacitor array is coupled to the first control signal and the negative-terminal input signal.

17. The circuit of claim 11, wherein in a charge redistribution stage, the first positive-terminal capacitor array is not coupled to the first control signal and the positive-terminal input signal, the first negative-terminal capacitor array is not coupled to the first control signal and the negative-terminal input signal, and the first positive-terminal capacitor array and the first negative-terminal capacitor array are coupled to the third reference voltage or the fourth reference voltage.

18. The circuit of claim 11, wherein the first control circuit compares a common mode voltage of the positive-terminal output signal and the negative-terminal output signal with the target common mode voltage to generate the first control signal.

19. The circuit of claim 14, further comprising:
a second positive-terminal capacitor array, coupled to a gate of the positive-terminal p-type transistor, wherein the second positive-terminal capacitor array is selectively coupled to a second control signal, the positive-terminal input signal, the third reference voltage and the fourth reference voltage; and
a second negative-terminal capacitor array, coupled a gate to of the negative-terminal p-type transistor, wherein the second negative-terminal capacitor array is selectively coupled to a second control signal, the negative-terminal input signal, the third reference voltage and the fourth reference voltage.

20. The circuit of claim 19, further comprising a second control circuit, configured to generate the second control signal according to the positive-terminal output signal, the negative-terminal output signal and the target common mode voltage.

* * * * *